United States Patent
Gassilloud (10) Patent No.: US 11,377,735 B2
(45) Date of Patent: Jul. 5, 2022

(54) APPARATUS FOR DEPOSITING CHALCOGENIDE THIN FILMS

(71) Applicant: COMMISSARIAT A L'ENERGIE ATOMIQUE ET AUX ENERGIES ALTERNATIVES, Paris (FR)

(72) Inventor: Remy Gassilloud, Saint-Laurent-du-Pont (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/345,848

(22) PCT Filed: Oct. 31, 2017

(86) PCT No.: PCT/FR2017/052998
§ 371 (c)(1),
(2) Date: Apr. 29, 2019

(87) PCT Pub. No.: WO2018/083415
PCT Pub. Date: May 11, 2018

(65) Prior Publication Data
US 2019/0256975 A1 Aug. 22, 2019

(30) Foreign Application Priority Data
Nov. 2, 2016 (FR) ........................... 1660583

(51) Int. Cl.
*C23C 16/30* (2006.01)
*C23C 16/455* (2006.01)
(Continued)

(52) U.S. Cl.
CPC ...... *C23C 16/45544* (2013.01); *C23C 16/305* (2013.01); *C23C 16/4488* (2013.01);
(Continued)

(58) Field of Classification Search
CPC ... C23C 16/30; C23C 16/448; C23C 16/4488; C23C 16/452; C23C 16/455;
(Continued)

(56) References Cited

U.S. PATENT DOCUMENTS

| 4,919,793 A | * | 4/1990 | Mallari | C10B 55/00 |
| | | | | 208/131 |
| 6,066,760 A | * | 5/2000 | Schon | C07C 303/16 |
| | | | | 562/118 |

(Continued)

FOREIGN PATENT DOCUMENTS

| EP | 2 899 295 A1 | | 7/2015 | |
| JP | 2-162685 | * | 6/1990 | ............. H05B 33/10 |
| WO | WO 2016-122081 | * | 8/2016 | ......... H01L 31/0236 |

OTHER PUBLICATIONS

Li, Chun, et al., "Role of Boundary Layer Diffusion in Vapor Deposition Growth of Chalcogenide Nanosheets: The Case of GeS". ACSNano, vol. 6, No. 10, pp. 8868-8877 (2012).*

(Continued)

*Primary Examiner* — Bret P Chen
(74) *Attorney, Agent, or Firm* — Oblon, McClelland, Maier & Neustadt, L.L.P.

(57) ABSTRACT

A device for depositing at least one radical chalcogenide thin film on an element to be treated including an intake area and a diffusion area receiving the element to be treated, the intake area and the diffusion area extending along a longitudinal axis, a radical hydrogen source connected to the intake area, pumping means, means for injecting a reagent reacting with the radical hydrogen to form $H_2S$, and means for supplying a precursor to the diffusion area. The injection means inject the reagent into a central area of the intake area in the longitudinal direction within the radical hydrogen flow. The pumping means are controlled so as to operate during the reagent injection, and generate a flow of $H_2S$ (Continued)

along the element to be treated in order to activate said element so as to absorb the precursor.

20 Claims, 6 Drawing Sheets

(51) Int. Cl.
*C23C 16/448* (2006.01)
*C23C 16/452* (2006.01)
(52) U.S. Cl.
CPC ...... *C23C 16/452* (2013.01); *C23C 16/45553* (2013.01); *C23C 16/45559* (2013.01); *C23C 16/45582* (2013.01)
(58) Field of Classification Search
CPC ........ C23C 16/45544; C23C 16/45553; C23C 16/45559; C23C 16/45582
See application file for complete search history.

(56) References Cited

U.S. PATENT DOCUMENTS

| | | | | |
|---|---|---|---|---|
| 6,214,116 B1* | 4/2001 | Shin | ............... | C23C 16/45504 118/640 |
| 6,342,277 B1* | 1/2002 | Sherman | ............... | C23C 16/50 427/562 |
| 6,511,539 B1* | 1/2003 | Raaijmakers | ......... | C23C 16/452 117/102 |
| 8,187,679 B2* | 5/2012 | Dickey | ............... | C23C 16/545 427/569 |
| 9,371,579 B2* | 6/2016 | Varadarajan | .......... | C23C 16/452 |
| 9,601,693 B1* | 3/2017 | Henri | ............... | H01L 45/126 |
| 2002/0197856 A1* | 12/2002 | Matsuse | ............ | H01L 21/28061 438/652 |
| 2003/0070620 A1* | 4/2003 | Cooperberg | ...... | C23C 16/45574 118/723 AN |
| 2005/0025640 A1* | 2/2005 | Sekiguchi | ............... | F04D 29/30 417/423.4 |
| 2006/0124459 A1* | 6/2006 | Strand | ............... | C07K 1/26 204/450 |
| 2007/0134919 A1* | 6/2007 | Gunji | ............... | C23C 16/452 438/680 |
| 2008/0095938 A1* | 4/2008 | Basol | ............... | C23C 14/0623 427/255.26 |
| 2009/0112009 A1* | 4/2009 | Chen | ............... | H01L 45/06 556/12 |
| 2009/0304924 A1* | 12/2009 | Gadgil | ............... | C23C 16/45551 427/255.5 |
| 2012/0111271 A1* | 5/2012 | Begarney | ............ | C23C 16/4584 118/724 |
| 2014/0154399 A1* | 6/2014 | Weikart | ............... | A61M 5/3129 427/2.3 |
| 2015/0170907 A1* | 6/2015 | Haukka | ............ | H01L 21/02192 438/779 |
| 2015/0211112 A1 | 7/2015 | Cadot et al. | | |
| 2016/0032457 A1* | 2/2016 | Tanabe | ............... | C23C 16/45525 118/666 |
| 2017/0092856 A1* | 3/2017 | Henri | ............... | H01L 45/06 |
| 2020/0066987 A1* | 2/2020 | Sims | ............... | H01L 21/67184 |

OTHER PUBLICATIONS

Engman, Lars, et al., "Redox Properties of Diaryl Chalcogenides and Their Oxides". J. Phys. Chem. 1994, 98, pp. 3174-3182.*
Sukhanov, M.V., et al., "New approach for preparation of high-purity sulfide-germanium glasses doped with praseodymium". Optical Materials Express, vol. 9, No. 8, Aug. 1, 2019, pp. 3204-3214.*
Zhang, Yueyan, et al., "Recent Advances on the Polymerization of Elemental Sulphur, Inverse Vulcanization and Methods to Functional Chalcogenide Hybrid Inorganic/Organic Polymers (CHIPs)". Polymer Chemistry, 2012, pp. 1-26.*
Hiramatsu, M., et al., "Fabrication of vertically aligned carbon nanowalls using capacitively coupled plasma-enhanced chemical vapor deposition assisted by hydrogen radical injection". Applied Physics Letters, vol. 84, No. 23, Jun. 7, 2004, pp. 4708-4710.*
Kondo, Shingo, et al., "Initial growth process of carbon nanowalls synthesized by radical injection plasma-enhanced chemical vapor deposition". Journal of Applied Physics, 106 (2009) 094302, pp. 1-6.*
Abrutis, Adulfas, et al., "Hot-Wire Chemical Vapor Deposition of Chalcogenide Materials for Phase Change Memory Applications". Chem. Mater. 2008, 20, 3557-3559.*
Aleiferis, Pavlos G., et al., "Controlled autoignition of hydrogen in a direct-injection optical engine". Combustion and Flame 159 (2012) 2500-2515.*
Salamone, Michela, et al., "Hydrogen Atom Abstraction Selectivity in the Reactions of Alkylamines with the Benzyloxyl and Cumyloxyl Radicals. The Importance of Structure and of Substrate Radical Hydrogen Bonding". J. Am. Chem. Soc. 2011, 133, 16625-16634.*
Sabbe, Maarten K., et al., "Hydrogen radical addition to unsaturated hydrocarbons and reverse B-scission reactions: modeling of activation energies and preexponential factors". ChemPhysChem, 11, 1, 195-210 (2010).*
International Search Report dated Jan. 12, 201 8 in PCT/FR2017/052998 filed on Oct. 31, 2017.
French Preliminary Search Report dated Mar. 27, 2017 in FR 1660583 filed on Nov. 2, 2016.
Short, A. et al., "Atomic layer deposition of zinc sulfide with Zn(TMHD)2," Journal of Vacuum Science & Technology A, vol. 31, No. 1, Jan./Feb. 2013, pp. 01A138-1 to 01A138-5. (Total 6 pages).
Kim, Y. et al., "Wafer-scale monolayer $MoS_2$ grown by chemical vapor deposition using a reaction of $MoO_3$ and $H_2S$," Journal of Physics: Condensed Matter, vol. 28, 2016, 184002, pp. 1-6.
Fujiwara, H. et al., "Low temperature growth of ZnS x Se1-x alloys fabricated by hydrogen radical enhanced chemical vapor deposition in an atomic layer epitaxy mode," Journal of Applied Physics, vol. 74, Nov. 1993, pp. 5510-5515. (Total 7 pages).

* cited by examiner

APPARATUS FOR DEPOSITING CHALCOGENIDE THIN FILMS

TECHNICAL FIELD AND STATE OF THE ART

The present invention relates to a device for depositing chalcogenide thin films and a deposition process using such a device.

Films made from chalcogenides of the $MX_2$ family, with M a group III-VI transition metal and X and a chalcogen of column VI beyond oxygen, for example $MoS_2$, $MoSe_2$, $MoTe_2$ or $WS_2$, $VS_2$, $TiS_2$, as well as ternary alloy mixtures of these chemical elements such as $Ti_xV_yS_2$, . . . with conductivity properties in the particular plane induced by the hexagonal 2H/tetragonal 1T crystal geometry of these planes.

Chalcogenide films can be produced by thin film atomic layer deposition (ALD). For example, in a chemical reactor containing the substrate on which the deposition is to be carried out, a halide of a transition element, for example $MoCl_5$, is alternately introduced with $H_2S$ as reactant. This process leads to technical difficulties due to the corrosion of column VII chemical elements. Moreover, the process involves handling $H_2S$, a toxic gas which is corrosive to reactor components.

Another technique to avoid the use of $H_2S$ is for example to use a transition hexacarbonyl, for example a tungsten hexacarbonyl, and a sulfur molecule such as dimethyl disulfide (DMDS). However, the hexacarbonyl solution is hardly viable in the ALD process, because the thermal decomposition window of this type of ligand is very small. Furthermore, some carbonyls are very toxic.

The document EP2 899 295 describes a process for producing by ALD a thin film of formula $MY_x$, with M tungsten and/or molybdenum and Y sulfide or selenium, in which $H_2S$ is produced in situ from a hydrogen radical source and DMDS. This document does not describe a device for implementing this process.

The document H. Fujiwara, JAP 74, 1993, p5510 also proposes, in order not to have to handle $H_2S$, to produce $H_2S$ directly in the reactor from a hydrogen radical source and DMDS. The deposition device proposed in this document does not allow for uniform deposition of layers over a large area.

DISCLOSURE OF THE INVENTION

It is therefore a goal of the present invention to offer a device for depositing chalcogenide thin films, allowing for uniform deposition and not having the disadvantages associated with the handling of $H_2S$ before deposition.

The above-mentioned goal is achieved by a device for depositing at least one atomic thin layer of a chalcogenide, comprising a gas diffusion device comprising an inlet zone and a diffusion zone downstream of the inlet zone in the direction of gas flow, said zones extending longitudinally, the diffusion zone being intended to receive the element on which the deposition is to be performed. The deposition device operates in sequences, these sequences include the step of absorption of an organometallic on a surface to be coated and a step of $H_2S$ activation. These sequences are repeated until the required thickness is reached. The device also includes a hydrogen radical source and first means for injecting a gaseous species, called reactant, capable of reacting with hydrogen radical to form $H_2S$ gas in situ, in the diffusion zone. The device also includes means for supplying the diffusion zone with at least one precursor. The hydrogen radical source is arranged with respect to the inlet zone such that the streamlines of the hydrogen radical flow are substantially parallel to the longitudinal direction.

The first injection means are such that the reactant is injected directly into a central zone of the inlet zone in such a way that the reactant is injected into the hydrogen radical flow.

The device also includes pumping means in the diffusion zone. The pumping means can be activated at least during the activation phase so as to create close contact between reactant and hydrogen radical and form $H_2S$ and to guide the $H_2S$ streamlines along the surface to be activated.

Thanks to the invention, on the one hand, $H_2S$ is produced in situ, there is no handling of a volume of $H_2S$ gas to be injected. On the other hand, since reactant injection takes place in a central zone of the inlet zone, with $H_2S$ formation taking place during the diffusion time between the injection and the surface to be activated, the $H_2S$ flow is central and will then be guided along the surface to be activated. Activation is then homogeneous, which promotes homogeneous absorption of the precursor in the following step. The uniformity of the chalcogenide deposition is then improved.

In one exemplary embodiment, the precursor molecule absorption step is performed by saturating the diffusion zone with precursor for a defined time, it is then a step of static saturation. A purge step then takes place.

In another exemplary embodiment, the precursor absorption step is performed dynamically by activating the pumping, the injection of organometallic then preferably takes place in a central zone and the streamlines of the precursor flow are also guided along the side of the element to be treated.

Very advantageously, the reactor includes means for producing a Venturi effect in the inlet zone further improving the close contact between hydrogen radical and reactant. For example, this Venturi effect is obtained by injecting the reactant at a high velocity compared to the average velocity of the hydrogen radical.

In a very advantageous example, a neutral gas injection downstream of the reactant injection takes place so as to form a layer of neutral gas, also called a neutral gas curtain, along the walls of the diffusion zone. The neutral gas injection is advantageously tangential to the walls of the inlet zone.

The subject-matter of the present invention is thus a device for depositing at least chalcogenide thin film on at least one side of an element to be treated comprising:
- an inlet zone,
- a diffusion zone connected to the inlet zone, the diffusion zone being intended to receive the element to be treated, the inlet zone and the diffusion zone extending along a longitudinal axis,
- a hydrogen radical source connected to the inlet zone and oriented so that the streamlines of the hydrogen radical flow in the hydrogen radical source are substantially parallel to the longitudinal axis,
- pumping means capable of providing pumping in the diffusion zone,
- first means for injecting a reactant capable of reacting with hydrogen radical to form $H_2S$,
- second means for injecting at least one precursor,
the first injection means being capable of injecting the reactant into a central zone of the inlet zone in the direction of the longitudinal axis toward the diffusion zone in such a way that the reactant is injected into the hydrogen radical flow, and the pumping means being controlled to operate at least during the injection of reactant and being oriented so as to generate a flow of the $H_2S$ produced along at least one side of the element to be treated parallel thereto in order to activate said side for the absorption of the precursor.

Preferably, the second precursor injection means ensure the injection of the precursor into the inlet zone, advantageously in a central zone of the inlet zone.

In one exemplary embodiment, the second injection means are merged with the first injection means and are connected alternately to a reactant source and a precursor source by means of at least one valve. The device may comprise a needle mounted transversely in the inlet zone and having a nozzle located substantially on the longitudinal axis in the direction of the diffusion zone, said needle being connected at one end by a two-way valve to the reactor source and a neutral gas source and at another end by a two-way valve to the precursor source and a neutral gas source.

Advantageously, the deposition device includes means for generating a vacuum downstream of the first injection means. In one exemplary embodiment, the means capable of generating a vacuum can inject the reactant at a velocity higher than an average velocity of the hydrogen radical flow. In another exemplary embodiment, the means capable of generating a vacuum include a zone of reduced cross-section downstream of the first injection means.

The deposition device may, in a preferred example, include third means for injecting a neutral gas into the inlet zone downstream of the reactant injection zone, so as to form a layer of neutral gas on an inner side of the diffusion zone.

The third means for injecting a neutral gas, for example, are arranged in a zone where the vacuum level is at its highest.

In one example, the diffusion chamber can be configured so that the side of the element to be treated is substantially perpendicular to the longitudinal axis and so that the pumping means provide pumping at the entire outer periphery of the element. The device may then have a plurality of windows evenly distributed in a wall of the diffusion zone and bordering the outer periphery of the element to be treated.

In another example, the diffusion chamber is configured so that the side of the element to be treated is substantially parallel to the longitudinal axis and in which the pumping means provides pumping at an edge of the element opposite to an edge opposite the inlet zone.

The neutral gas injection means can be configured to inject a neutral gas flow substantially tangentially to a side wall of the inlet zone.

According to an additional feature, the first and/or the second injection means each have one or more nozzles evenly distributed in the inlet zone.

For example, the diffusion zone has an acute hyperbolic form.

Another subject-matter of the present invention is a process for depositing at least one thin film on at least one side of an element to be treated using a deposition device according to the invention, comprising the steps of:

a) Placing the element in the device so that at least one side is located in the diffusion zone,
b) Activating the pumping means,
c) Injecting the inlet zone with at least one precursor,
d) Purging the diffusion zone,
e) Injecting the reactant and generating hydrogen radical,
f) Purging,
g) Repeating steps c) to f) until a film of the desired thickness is obtained.

In one embodiment, the pumping means are stopped at least during the injection of the at least one precursor.

The process may include a step prior to step a) of injecting a neutral gas along an inner side of the diffusion zone downstream of the injection zone.

Advantageously, the reactant is injected at a velocity higher than an average velocity of the hydrogen radical flow.

BRIEF DESCRIPTION OF THE DRAWINGS

The present invention will be better understood on the basis of the following description and the attached drawings wherein.

DETAILED DISCLOSURE OF SPECIFIC EMBODIMENTS

In the present application, upstream and downstream are to be considered in the direction of gas flow from the inlet zone toward the diffusion zone.

Figures 1A, 1B:
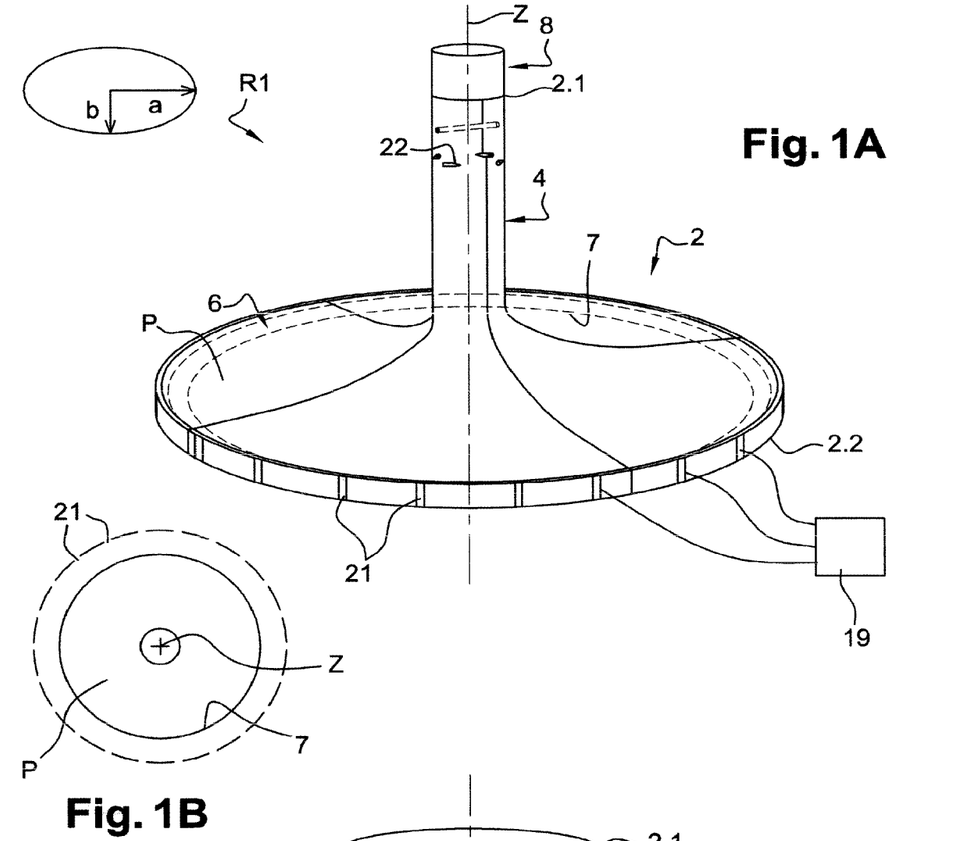
FIG. 1A is a schematic perspective view of a first embodiment of a deposition device according to the invention.
FIG. 1B is a bottom view of the device in FIG. 1A at the substrate P, the slits 19 being shown in an apparent manner.
Figure 2:
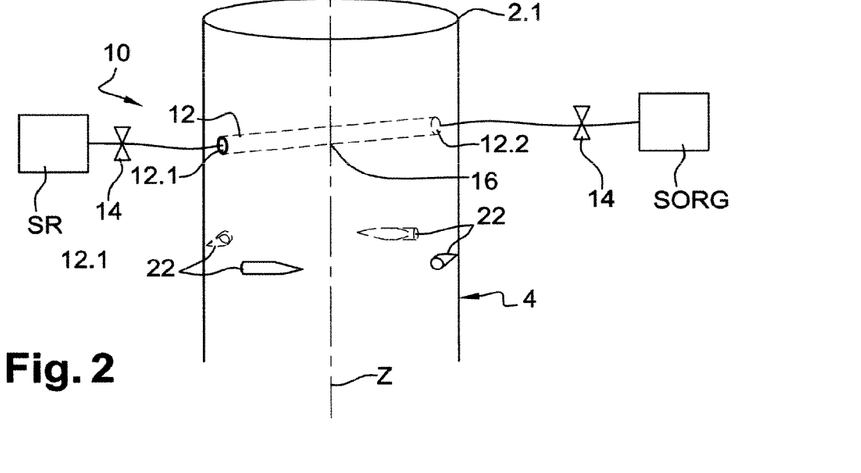
FIG. 2 is a detailed view of the diffuser in FIG. 1 at the inlet zone.

FIGS. 1A, 1B and 2 present a schematic exemplary embodiment of a thin film deposition device R1, hereinafter ALD device.

The ALD device has a diffuser 2 extending along a longitudinal axis Z. It has a first end 2.1 and a second end 2.2 distributed along the axis Z.

It has an inlet zone 4 comprising the first end 2.1 and a diffusion zone 6 comprising the second end 2.2.

The two zones 4, 6 are connected to each other in such a way that they have a continuous side wall. Examples of the geometry of this wall will be described in detail below.

The part P, for example a microelectronic substrate, on which the film deposition is to be carried out is placed in the reactor in the diffusion zone 6 at the second end. The diffuser in FIGS. 1A and 2 allows the deposition on only one side of the part P, this side will be designated later on as the deposition side.

In the example shown, the reactor has rotational symmetry around the axis Z, but this is by no means limiting as described below.

In the example shown, the inlet zone is cylindrical with a circular cross-section and the diffusion zone is flared. The inlet zone has a length of between 10 mm and 1000 mm, for example. The sum of the length of the inlet zone and the length of the diffusion zone allows the diffusion time of the reactant molecule to be defined, during which time it is sought to come into contact with hydrogen radical as described below.

FIG. 1B shows, seen from below, the substrate P placed in the second end 2.2 of the diffusion zone. The second end 2.2 has a border 7 bordering the substrate contour. In the example shown, the substrate P has a disc shape and the border 7 is circular. It will be understood that the substrate may have any other shape, for example a square shape called pseudo-square, the border 7 then has a square shape. Square or rectangular substrates are used, for example, to make solar cells.

Preferably, the flared wall of the diffusion zone has an acute hyperbolic shape. This shape limits vortices near the diffuser wall. Furthermore, this shape reduces the internal volume of the diffuser, which reduces the reactor purge time and increases the deposition rates. For example, when viewed in cross-section, the profile on one side of the diffusion zone is a quarter ellipse of type $(x/a)^2+(y/b)^2=1$ with a and b representing the major axis and minor axis, respectively. The ellipse is shown in dotted lines in FIG. 1A.

Advantageously, $a/1000 \leq b \leq 10 \times a$.

In a variant, a conically shaped diffusion zone may be provided. The diffusion zone is then obtained by revolution about the axis Z of a right triangle whose two sides defining the right angle are a and b, a being the radius of the second end of the diffuser.

A source of hydrogen radical or atomic hydrogen 8 is connected to the inlet zone at the first end 2.1.

In the example shown, the hydrogen radical source 8 is upstream of the inlet zone.

Preferably it is aligned with it along the axis Z to reduce recombinations between hydrogen radical atoms. Thus, the streamlines of the hydrogen radical flow are substantially parallel to the axis Z. Preferably, the diameter of the source 8 and the diameter of the inlet zone are close. For example, they are in the order of a few tens of mm, preferably between 40 mm and 70 mm. Monoatomic hydrogen radical has an unpaired electron on its outer layer and is very chemically unstable.

The hydrogen radical source uses, for example, capacitive means such as RF. Two electrodes, for example of $Al_2O_3$ or $SiO_2$, are arranged opposite each other in an electrically insulating tube orthogonally to the axis of the tube, a voltage is applied between the two electrodes and the tube is traversed by a flow of $H_2$ and Argon. The axis of the tube is aligned with the axis Z.

In a variant, the hydrogen radical source uses, for example, inductive means, for example by microwave or inductively coupled plasma (ICP). An electrically insulating tube is surrounded by an inductor. The tube is crossed by a flow of $H_2$ and of argon. The argon molecules are excited and come into contact with the $H_2$ molecules which produce H*. The axis of the tube is aligned with the axis Z.

The diffuser comprises first means 10 for injecting a reactant intended to react with hydrogen radical H* to form $H_2S$ gas in situ. In the example shown, the reactor also has second means for injecting at least one organometallic or precursor.

The process for forming chalcogenide films which can implement the device according to the invention is described in the document EP 2 899 295.

For example, the reactant can be selected from the chemical group $Y_xR_y$, with Y=S or Se or Te and R=H and/or alkyl and/or allyl and/or aryl and $1 \leq x \leq 4$ and $1 \leq y \leq 8$; for example YR, $YR_2$; $Y_2R$; $Y_2R_2$; $Y_3R_2$; $Y_2R_3$. The alkyl group R mentioned above is advantageously a linear or branched alkyl having 1 to 8 carbon atoms, and even more advantageously 1 to 4 carbon atoms.

The precursor of the element Y can be used alone or mixed with hydrogen. The compounds $Y_2R_2$ and $Y_3R_2$ are advantageously used in a mixture with hydrogen. This hydrogen can advantageously be in the form of plasma.

The precursor of the element Y can be selected from the group consisting of methyl disulfide; 1,2-ethanedithiol ($Y_2R_3$=HS—$C_2H_4$—SH); dimethyl disulfide (DMDS); diethyl disulfide (DEDS); dipropyl disulfide (DPDS); dibutyl disulfide (DBDS); di-tert-butyl disulfide (DTBDS); methyl diselenide; ethyl diselenide; dimethyl diselenide (DMDSe); diethyl diselenide (DEDSe); diisopropyltelluride (DIPTe) and tert-butyl mercaptan (tBuSH).

According to a preferred embodiment, the precursor of the element Y may be: $H_2Y$ alone; or 1,2-ethanedithiol (HS—$CH_2CH_2$—SH) alone; or the mixture $H_2/Y_2R_2$, or $H_2$/DMDS, $H_2$/DEDS, $H_2$/DPDS, $H_2$/DBDS, $H_2$/DTBDS, $H_2$/DMDSe, $H_2$/DEDSe, $H_2$/DIPTe, $H_2$/tBuSH.

The organometallics allowing the formation of chalcogenide film can be selected from among the families: metal alkyl, metal cyclopentadienyl, metal amide and/or imide, metal carbonyl, metal phosphide, and a mixture of these chemical groups, for example TDMATi, TDEATi, TDMAZr, $TiCl_4$, TDEAZr, TEMAZr, $ZrCl_4$, Tris(Dimethylamino)CpZr (ZyALD), TDMAHf, TEMAHf, TDEAHf, Tris(Dimethylamino)CpZr (HyALD), $HfCl_4$, TDMAV, TEMAV, $Cp_2V$, $Cp(CO)_4V$, PDMANb, TBTDENb, TBTDETa, TAIMATa, PDMATa, $CP_2Cr$, $Cr(CO)_6$, TDEAMo, TDMAMo, TEMAMo, $Mo(CO)_6$, TDEAW, TDMAW, TEMAW, $W(CO)_6$, WF6.

The first injection means are such that the reactant is injected into the inlet zone in a central zone thereof, i.e. substantially at the longitudinal axis Z or in a zone surrounding and near said axis. In the example shown, the first injection means include a tube or needle 12 mounted transversely in the cylinder of the inlet zone. Preferably, the needle 12 extends along a diameter of the inlet cylinder so as to maintain symmetry in the inlet zone.

The needle passes through the cylinder of the inlet zone and its ends open laterally outside the inlet zone. In the example shown, the needle 12 has two open ends. One end 12.1 is connected to a reactant source SR and the other end 12.2 is connected to a precursor or organometallic source SORG. Valves 14 are provided at the ends 12.1 and 12.2 to control the needle supply alternately by the reactant and the organometallic.

The needle 12 has a port 16 called a nozzle, substantially on the axis Z on the side of the diffusion zone so as to project the reactant into a central zone of the inlet zone and thus into a central zone of the diffusion zone. In a variant, several nozzles arranged symmetrically with respect to the axis Z and located in a central zone of the inlet zone could be provided.

In the present application, "central zone" means a zone extending around the longitudinal axis. In the case of an inlet zone with a circular cross-section, the central zone is also of circular cross-section and has a radius smaller than the inner radius of the inlet zone, preferably less than half the radius of the inlet zone.

Advantageously, the diameter of the nozzle 16 is chosen small enough to provide molecules with a high velocity along the Z-axis relative to the average velocity flow in the inlet zone, particularly that at the outlet of the H* source, to create a vacuum downstream of the needle, the role of which will be explained below. For example, the diameter of the needle is comprised between 0.5 mm and 10 mm and is preferably equal to 2 mm. The nozzle diameter is chosen according to the reactant flow rate, the organometallic flow rate at the needle inlet, the desired gas velocity at the needle outlet and the H* flow rate. For example, the diameter of the nozzle is comprised between 0.1 mm and 5 mm and is preferably equal to 1 mm.

In the example shown, the needle 12 therefore also forms the second injection means.

Separate first and second injection means could be provided. Furthermore, it could be expected that the first and second injection means will have several nozzles. For example, in FIG. 9 four nozzles are shown. The four nozzles can be used to successively inject the reactant and the precursor, to that end connection valves to the reactant and precursor sources are provided. In a variant, two nozzles dedicated to the injection of reactants and two nozzles dedicated to the injection of precursors could be provided.

Figure 9:
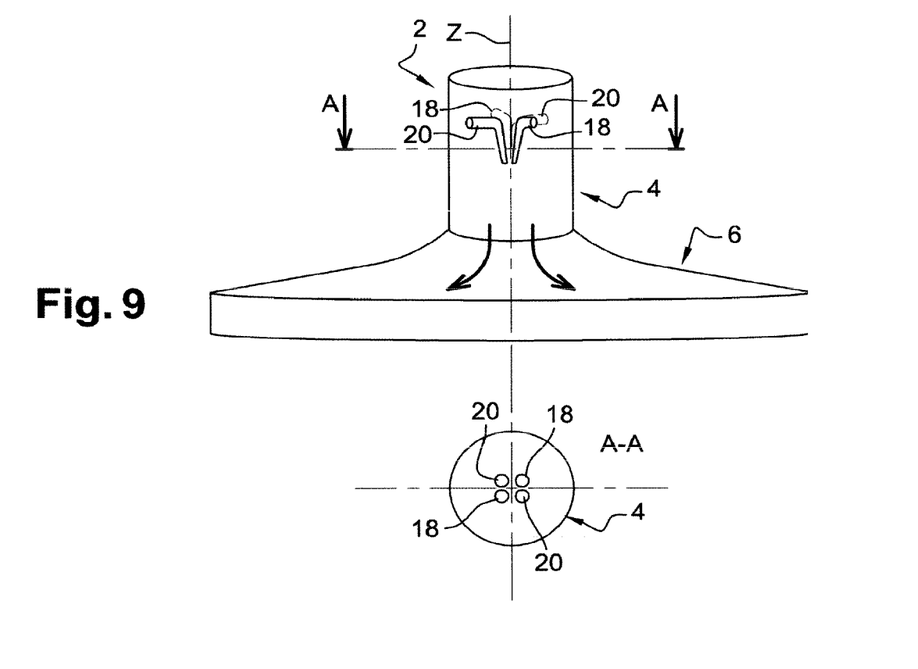
FIG. 9 is a perspective and cross-sectional view along the AA plane of another example of a diffuser according to the invention.

Preferably, the nozzles are arranged symmetrically in the inlet zone so as to have a uniform effect on the flow of hydrogen throughout the cross-section of the inlet zone. In FIG. 9, the first injection means have two nozzles 18 and the second injection means have two nozzles 20, the nozzles 20 alternating with the nozzles 18 and forming a 90° angle between them. The nozzles are oriented so that the nozzle is oriented in the direction of the axis Z. The nozzles of the first injection means are such that their nozzle is located in the central zone of the inlet zone.

Preferably, the second injection means injecting the precursor(s) are also such that their nozzle is in the central zone. The deposition of precursor is thus optimized, which reduces the amount of organometallic required for each adsorption step.

It will be understood that the number of nozzles could be higher and that the number of reactant and organometallic nozzles could be different. The number and size of the nozzles are chosen so as not to occupy too large a surface area of the cross-section of the inlet zone in order to provide a sufficient H* passage cross-section. Preferably, the ratio between the cross-sectional area occupied by the Si nozzles and the cross-sectional area of the H*, SH* Si/SH*<¼

The deposition process is carried out by repeating successive steps of absorption of organometallic molecules on the deposition side and activation by means of $H_2S$. After each absorption step, the reactor is purged by the circulation of a neutral gas. The reactor also includes pumping means 19 which, on the one hand, guide the streamlines of at least $H_2S$ along the deposition side and, on the other hand, ensure the purge steps.

To that end, the pumping means 19 ensure pumping at the level of the element P. In the example shown, the wall of the diffusion zone has slit-shaped windows distributed over the entire contour of the second end of the diffusion zone just upstream of the deposition side of the element P. The slits 21 are connected via one or more conduits to a pump providing annular pumping at the element P. This pumping generates a suction flow of at least $H_2S$ with velocity vectors parallel to the deposition side and oriented radially, which promotes uniform activation of the deposition side for a subsequent precursor absorption step. The chalcogenide deposition obtained is therefore more uniform.

According to a variant embodiment, the pumping means could include a pumping well located under the substrate.

Very advantageously, the reactor has protective means capable of generating a layer of neutral gas along the inner surface of the diffusion zone wall to limit contact between the reactant and precursor molecules and said surface. In the example shown in FIG. 1A, these protective means have one or more injection holes 22 in the wall of the inlet zone downstream of the nozzles, said injection holes 22 are shaped such that the neutral gas is injected tangentially into the inlet zone. The neutral gas thus injected forms a vortex at the inner surface of the inlet zone and the diffusion zone and protects them against corrosion, for example due to $H_2S$.

The ports are connected to a neutral gas source. Preferably, the injection holes 22 are arranged with respect to the nozzles so as to be in the zone in which the pressure drop generated by the Venturi effect due to the high velocity injection of the reactant by the nozzle is greatest, thus avoiding an upstream counterflow of the neutral gas. The axis of the injection hole(s) is oriented substantially tangentially to the wall of the inlet zone. Preferably they are evenly distributed at an angle in the wall of the inlet zone. In the example shown, the protective means have four injection holes 22. But they could have between 1 and 50 holes, for example. For example, the diameter of the injection holes is comprised between 0.1 mm and 5 mm, and is preferably equal to 1 mm.

The use of these protective means is very advantageous when the reactor walls are made of materials likely to deteriorate in contact with the reactant, the precursor or the $H_2S$. In the case of walls made of resistant materials such as titanium, or aluminum covered with a PTFE layer, the use of protective means may be omitted.

To clean the inside of the reactor, $NH_3/H_2$ can be injected through the plasma, very reactive HF* radicals are produced.

FIGS. 3A to 5B show the finite element simulations of the reactant, H* and neutral gas streamlines within a diffuser according to the invention. The conditions considered for the simulation are:

injection into the needle 50 sccm;
H* flow 250 sccm;
neutral gas flow at the inlet of the tangential injection 125 sccm;
pressure in the diffuser 80 PA=600 mT.

The representations 3A-3B, 4A-4B and 5A-5B separately represent the reactant, H* and neutral gas streamlines, respectively, said streamlines being obtained by the same finite element simulation.

Figure 3A:
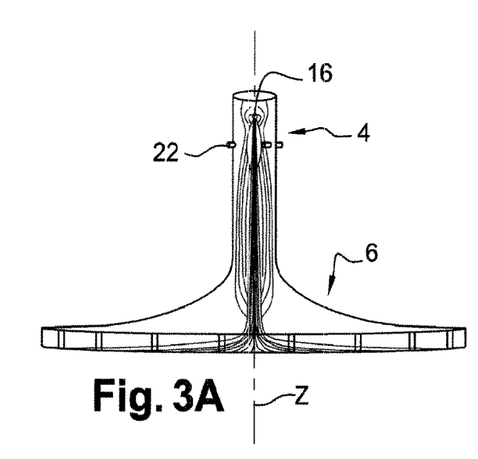
FIGS. 3A and 3B are cross-sectional and perspective views, respectively, of the diffuser in FIG. 1 during a reactant injection step.

FIG. 3A shows a longitudinal cross-sectional view of the diffuser when the reactant is injected by the nozzle. The velocity at the nozzle is about 50 cm/s.

Figure 4A:
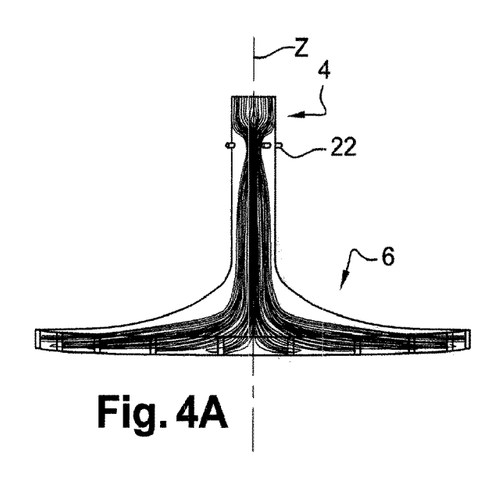
FIGS. 4A and 4B are cross-sectional and perspective views of the diffuser in FIG. 1 during a reactant injection and hydrogen radical generation step, respectively.

FIG. 4A shows the streamlines at the outlet of the H* source.

Due to the vacuum generated by the Venturi effect resulting from high velocity injection of the reactant, the H* flow velocity is also accelerated and the H* streamlines narrow downstream of the needle at the vacuum generated by the injection velocity of the reactant.

This narrowing of the streamlines promotes contact between the reactant and H* and promotes the formation of $H_2S$ in situ according to the following reaction in the case where the reactant is DEDS:

$DEDS+5H_2 \rightarrow 2H_2S+4CH_4$.

Figure 3B:
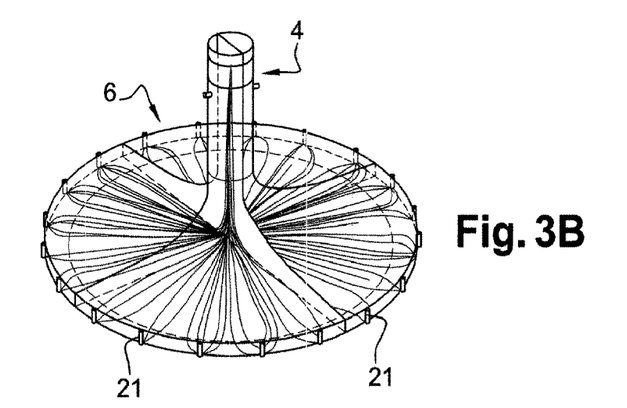
Figure 4B:
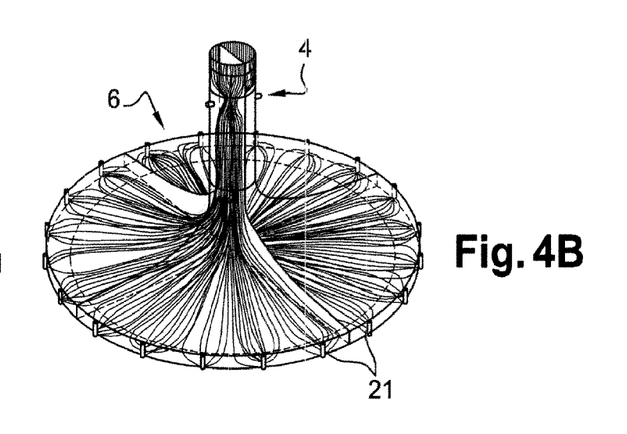

In addition, it can be seen in FIGS. 3A and 4A and in FIGS. 3B and 4B that by means of pumping the $H_2S$ flow streamlines slide as close as possible to the deposition side and uniformly over the entire surface.

In the example in FIGS. 1A and 2, it should be noted that the precursor is injected under the same conditions. The streamlines of the precursor are similar to those of the reactant in FIGS. 3A and 3B.

Figure 5A:
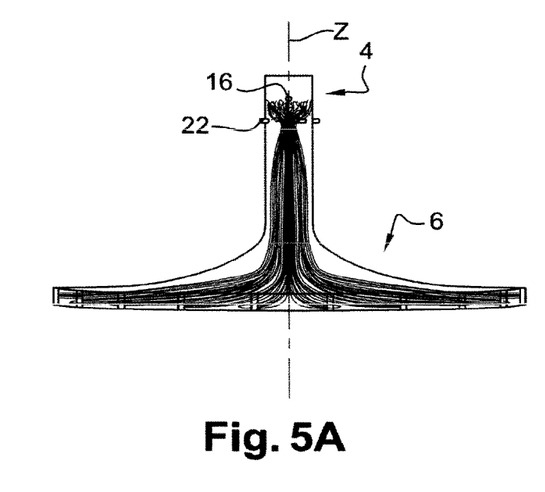
FIGS. 5A and 5B are cross-sectional and perspective views, respectively, of the diffuser in FIG. 1 during a reactant injection and hydrogen radical generation and neutral gas injection step so as to form a neutral gas curtain.
Figure 5B:
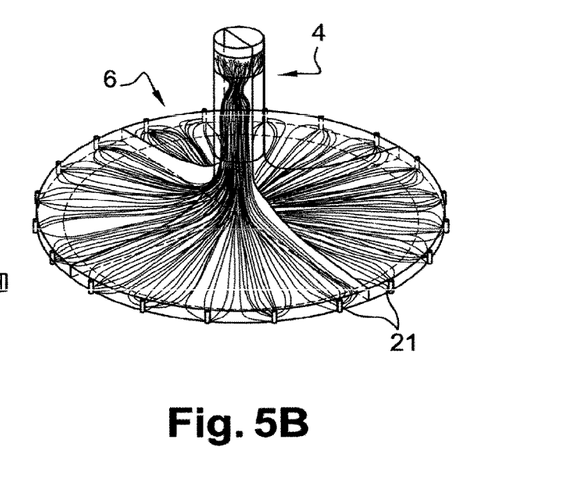

In FIGS. 5A and 5B, the streamlines of the tangentially injected neutral gas can be seen. It can be seen that these slide along the inner surface of the diffuser, forming a protective layer, and join the pumping slits without coming into contact with the deposition side. This layer of neutral gas does not disturb the deposition.

Figure 6:
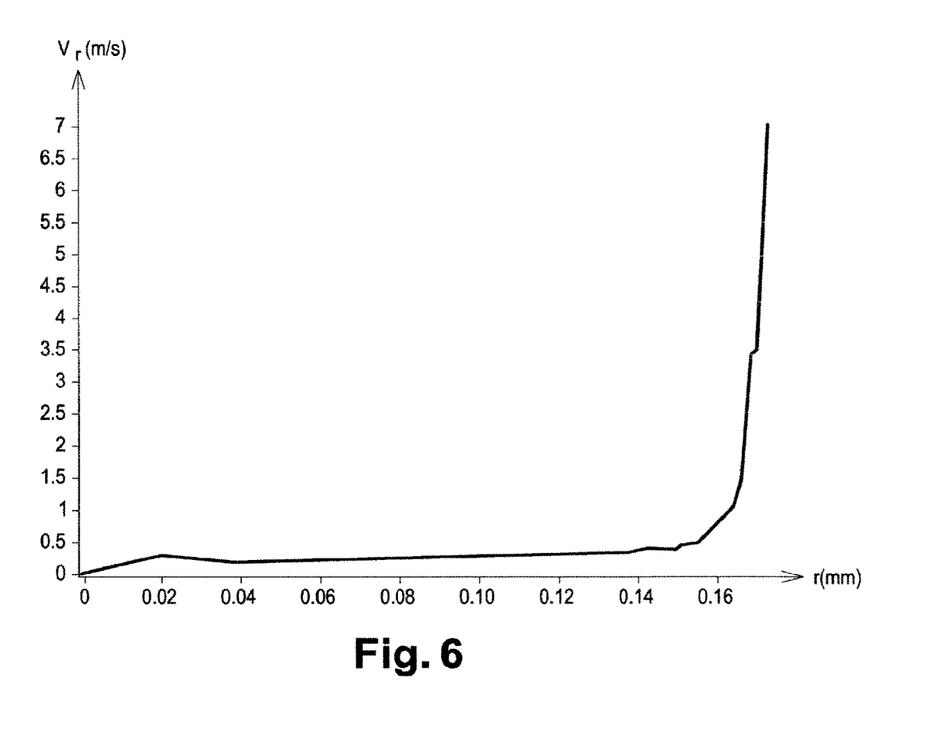
FIG. 6 is a graphical representation of the variation in flow velocity parallel to the plate as a function of the plate radius.

FIG. 6 shows a graphical representation of the radial velocity variation Vr at 1 mm from the deposition side as a function of the radius r of the element P.

It can be seen that the velocity is very uniform over the entire surface except at the radially outer end at the pumping slits. The radial velocity is on average 50 cm/s.

Figure 7:
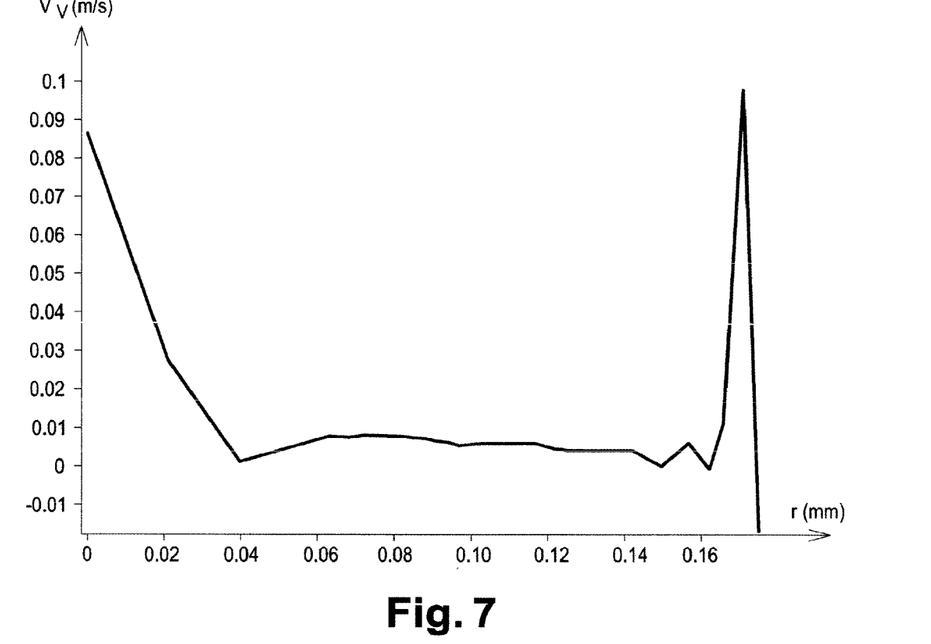
FIG. 7 is a graphical representation of the variation in flow velocity perpendicular to the plate as a function of the plate radius.

FIG. 7 shows a graphical representation of the vertical velocity variation Vv d at 1 mm from the deposition side as a function of the radius r of the element P.

It can be seen that the vertical velocity is relatively uniform over a large part of the surface outside the central zone and the radially outer end at the pumping slits. The radial velocity is on average 9 cm/s.

These homogeneous velocities ensure a homogeneous adsorption of the molecules on the deposition side.

The operation of the device in FIGS. 1A and 2 will now be described.

The element P is placed in the reactor at the second end of the diffuser.

The pumping means are activated.

A neutral gas is injected tangentially through the injection holes 22 so as to form a protective layer on the inside of the diffuser.

During a subsequent step, one of the valves 14 is switched to inject the precursor/organometallic from the source SORG through the needle 12. The precursor flows substantially vertically along the axis Z and then flows radially outward along the deposition side. The molecules are absorbed on the deposition side. The injection is stopped by the needle after a certain time.

The unabsorbed precursor molecules are purged.

Then an activation step takes place, the other valve 14 is switched on to inject from the source SR the reactant by the needle 12, simultaneously H* are produced by the source and flow into the inlet zone. Pumping is maintained. The reactant is injected into the central zone of the inlet zone at a high velocity greater than the average velocity of the H* flow, creating a vacuum downstream of the needle. The reactant molecules and H* react with each other to form $H_2S$, this reaction takes place during the diffusion time between the needle and the deposition side. The reactant and the H*, then the $H_2S$ formed are guided along the axis Z and then radially along the deposition side.

Thanks to the invention, because of the injection of the reactant into the hydrogen radical flow, the reactant and the H* are brought into close contact to produce $H_2S$. In addition, the flow along the deposition side ensures uniform activation.

The vacuum generated at the nozzle also prevents the neutral gas from backing up to the H* source. Indeed, as explained above, hydrogen radical can be produced from a mixture of Ar, $N_2$ or He and $H_2$. Moreover, the neutral gas used to protect the walls of the diffusion zone can be Ar, $N_2$, He. It is therefore desirable to avoid a rise in Ar injected through the injection holes with the hydrogen radical source in order not to modify the operating conditions of the latter.

The injection of the precursor and the injection of the reactant are repeated until the desired thickness is obtained.

In the above example, the precursor is injected and absorbed dynamically, the pumping means being activated.

In a variant to static operation, it could be envisaged, during the precursor injection step, that the pumping means be stopped and the diffusion zone saturated with precursor and wait for a given time for at least part of the precursor molecules to be absorbed. In this case, it is possible to introduce the precursor through a supply port, for example, in the wall of the diffusion zone.

Figure 8:
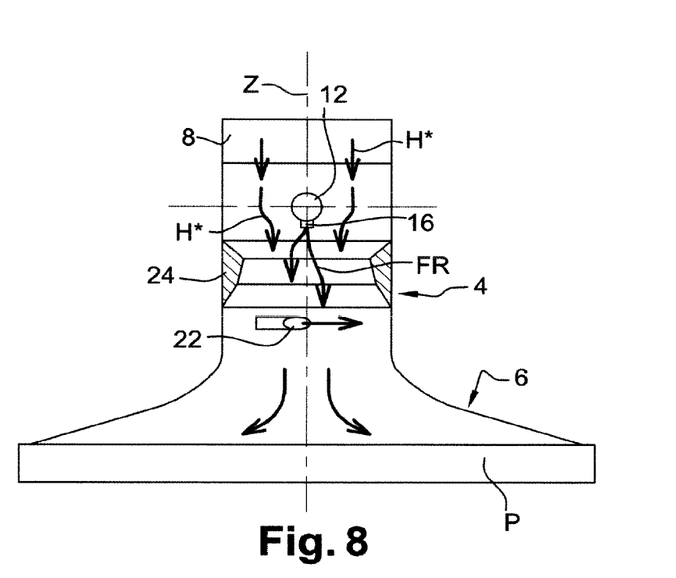
FIG. 8 is a cross-sectional view of another example of a diffuser according to the invention.

FIG. 8 shows another exemplary embodiment of a diffuser according to the invention, in which the inlet zone has a zone 24 of reduced diameter downstream of the injection of the precursors so as to produce a Venturi effect for promoting contact between the reactant and H*. The injection velocity of the reactant can then be reduced. A schematic representation of the streamlines of the H* flow and the streamlines of the reactant flow FR can be seen. It can be seen that the H* streamlines are substantially parallel to the axis Z at the outlet of the source 8 and are deformed to narrow toward the axis Z due to the vacuum.

The neutral gas injection holes are located downstream of the reduced diameter zone 24 in order to limit the counter-flow diffusion of the neutral gas.

Figure 10A:
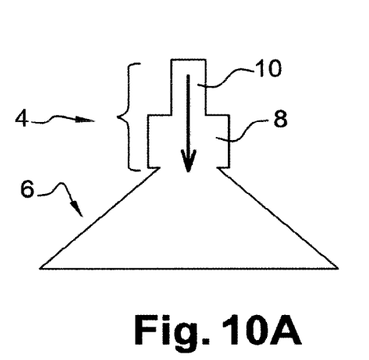
FIGS. 10A and 10B are variant embodiments of the diffuser.
Figure 10B:
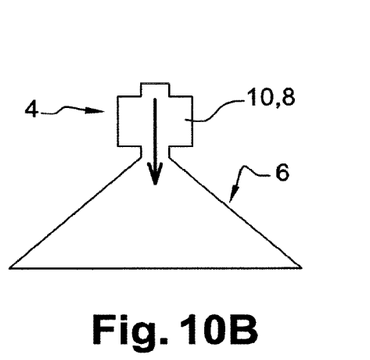

FIGS. 10A and 10B show schematic representations of variant embodiments.

According to a first variant shown in FIG. 10A, the H* source 8 is located downstream of the reactant injection means and forms part of the inlet zone. The streamlines of the H* flow produced are parallel to the axis Z and the risk of collision between the H* are reduced. The reactant is injected into a central zone of the inlet zone directly into the H* flow produced. Close contact is therefore promoted.

The precursor injection means may be upstream or downstream of the H* source.

The reduced cross-sectional area 24 may be provided downstream of the H* source to further promote contact between hydrogen radical and reactant.

If protective means injecting a neutral gas are provided, they are advantageously provided downstream of the zone 24 in order to prevent a counter-flow of the neutral gas toward the H* source.

According to a second variant shown in FIG. 10B, the reactant injection means are at the same level as the H* source. The source then partially forms the inlet zone. For example, the nozzles pass through the electrically insulating tube used in inductive and capacitive technologies and inject the reactant into the core of the H* source. The precursor injection means may be merged with the reactant injection means or may be separate and arranged downstream or upstream.

The reactant is then injected into the core of the source, close contact is also encouraged.

Figure 11:
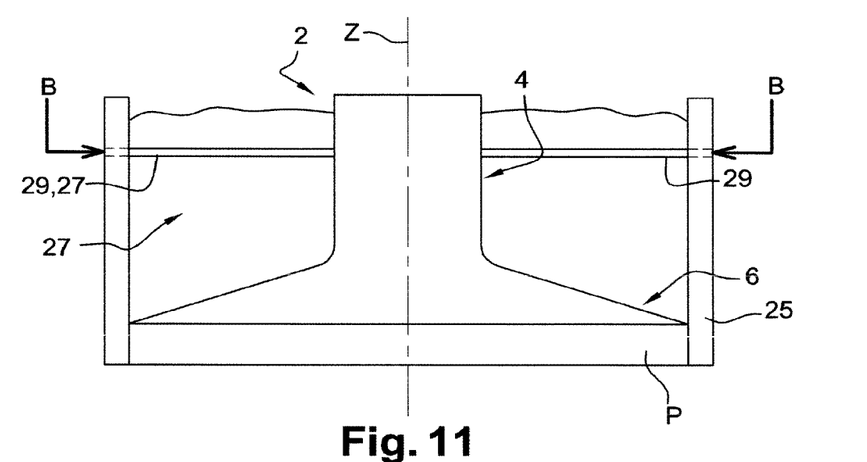
FIG. 11 is a schematic representation of another exemplary embodiment of a deposition device according to the first embodiment.

FIG. 11 shows another exemplary embodiment of a diffuser that can be implemented in a deposition device according to the invention. This includes a diffuser thermalization system comprising an enclosure 25 surrounding the diffuser in which a coolant 27 can circulate to maintain the diffuser wall and the connection lines 29 of the nozzles and/or supply means at a regulated temperature, for example comprised between −40° C. and 300° C., preferably equal to 70° C.

In the example described in FIGS. 1A and 2, the inlet zone and the diffusion zone have rotational symmetry around the axis Z. But it could be expected, for example, that the inlet zone and the diffusion zone have an elliptical or rectangular cross-section.

Figure 12:
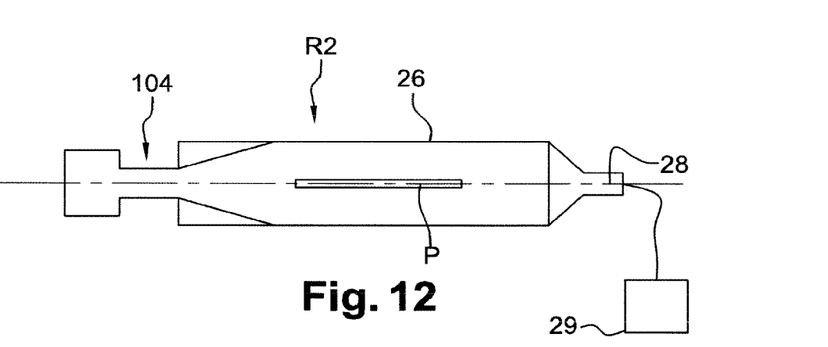
FIG. 12 is a longitudinal cross-sectional view of an example of a second embodiment of a cross-flow type deposition device according to the invention.

FIG. 12 shows another exemplary embodiment of a device R2 according to the invention which differs from the device R1 in that it includes a deposition chamber 26 of parallelepiped shape, in which the element P can be entirely arranged, the deposition being possible over the entire external surface of the element P. The device is symmetrical with respect to the plane 28. This type of reactor geometry is called cross-flow. In the example shown, the element P is in the plane 28, but it could be shifted with respect to said plane. In addition, several plates superimposed and at a distance from each other could be arranged in the device R2.

The inlet zone has, for example, an oblong section. The H* source is upstream of the inlet zone.

The reactant injection means inject the reactant substantially into a central zone of the inlet zone at the plane 28.

The device R2 includes pumping means 29 with a tapering portion between the chamber and a tube connected to a pump. The pumping means are such that they create a flow parallel to the larger cross-sectional faces of the element P, so as to ensure a flow at least of $H_2S$ along the larger cross-sectional faces(s) of the element P.

All the variants described in relation to FIGS. 1A and 2 apply to the reactor R2.

Figure 13:
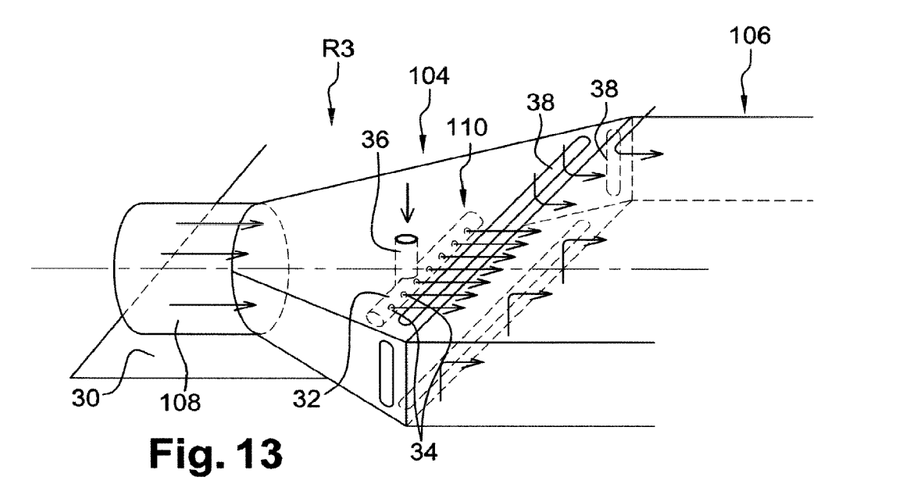
FIG. 13 is a schematic representation in perspective of another example of a deposition device according to the second embodiment.

FIG. 13 shows another example of a device R3 using cross-flow technology.

The device R3 has an inlet zone 104 with an upstream to downstream flared shape with a rectangular cross-section, and a diffusion zone 106 with a parallelepiped shape. The device is symmetrical with respect to the plane 30.

The first injection means 110 are such that they inject substantially into the plane 30. In the example shown, the injection means have a tube 32 closed at both ends and extending in the plane 30 perpendicular to the direction of flow. It has a plurality of nozzles 34 made in the wall of the tube. The tube is fed by a lateral connection 36 through the wall of the inlet zone. This multiple nozzle can be used to inject both the reactant and the precursor.

The H* source 108 is upstream of the inlet zone and preferably aligned therewith.

The reactor also includes protective means forming a layer of neutral gas on the wall of the diffusion zone. These protective means include injection windows 38 extending transversely in the inlet zone upstream of the diffusion zone. In the example shown, they have one elongated window per side. In a variant, a plurality of injection holes could be provided.

Preferably, these windows 38 are provided in the highest pressure drop zone.

The diffusion zone also includes pumping means (not shown), for example similar to those of the device R2, capable of generating a flow parallel to the larger surface area faces of the element P.

All variants described in relation to FIGS. 1A and 2 apply to the reactor R3.

Cross-flow reactors have the advantage of making depositions faster and allowing deposition on square plates, for example for the production of solar cells.

The operation of the devices R2 and R3 is similar to that of the device R1.

Thanks to the invention, a more uniform chalcogenide deposition is obtained and the handling of a large volume of $H_2S$ before deposition is avoided.

The invention claimed is:

1. A device for depositing at least chalcogenide thin film on at least one side of an element to be treated comprising:
   an inlet zone,
   a diffusion zone connected to the inlet zone, the diffusion zone being configured to receive the element to be treated, the inlet zone and the diffusion zone extending along a longitudinal axis,
   a hydrogen radical source connected to the inlet zone and oriented so that the streamlines of the hydrogen radical flow in the hydrogen radical source are substantially parallel to the longitudinal axis (Z),
   a pump configured to pump in the diffusion zone,
   at least a first injector for injecting a reactant capable of reacting with hydrogen radical to form $H_2S$, and
   at least a second injector for injecting at least one precursor,
   wherein the at least first injector is configured to inject the reactant into a central zone of the inlet zone in the direction of the longitudinal axis toward the diffusion zone in such a way that the reactant is injected into the hydrogen radical flow, wherein the hydrogen radicals intersecting with the reactant occurs firstly in the inlet zone, not in the diffusion zone, and
   wherein the pump is controlled to operate at least during the injection of reactant and are oriented so as to generate a flow of the $H_2S$ produced along at least one side of the element to be treated parallel thereto in order to activate said side for the absorption of the precursor.

2. The deposition device according to claim 1, wherein the at least second injector ensures the injection of the precursor into the inlet zone.

3. The deposition device according to claim 2, wherein the at least second injection is merged with the at least first injection injector and is alternately connected to a reactant source and a precursor source via at least one valve.

4. The deposition device according to claim 1, comprising a device capable of generating a vacuum downstream of the at least first injector.

5. The deposition device according to claim 4, wherein the device capable of generating a vacuum provokes an injection of the reactant at a velocity higher than an average velocity of the hydrogen radical flow.

6. The deposition device according to claim 4, wherein the device capable of generating a vacuum has a zone of reduced cross-section downstream of the at least first injector.

7. The deposition device according to claim 1, comprising at least a third injector for injecting a neutral gas into the inlet zone downstream of the reactant injection zone, so as to form a layer of neutral gas on an inner side of the diffusion zone.

8. The deposition device according to claim 7, comprising a device capable of generating a vacuum downstream of the at least first injector and wherein the at least third injector is arranged in a zone in which the vacuum level is maximum.

9. The deposition device according to claim 1, wherein the diffusion chamber is configured so that the side of the element to be treated is substantially perpendicular to the longitudinal axis and wherein the pump provides pumping at the entire outer periphery of the element.

10. The deposition device according to claim 9, comprising a plurality of windows distributed evenly in a wall of the diffusion zone and bordering the outer periphery of the element.

11. The deposition device according to claim 1, wherein the diffusion zone is configured so that the side of the element to be treated is substantially parallel to the longitudinal axis and wherein the pump provides pumping at an edge of the element opposite an edge facing the inlet zone.

12. The deposition device according to claim 1, comprising at least a third injector for injecting a neutral gas into the inlet zone downstream of the reactant injection zone, so as to form a layer of neutral gas on an inner side of the diffusion zone, and wherein the at least third injector is configured to inject a flow of neutral gas substantially tangentially to a side wall of the inlet zone.

13. The deposition device according to claim 3, comprising a needle mounted transversely in the inlet zone and having a nozzle located substantially on the longitudinal axis in the direction of the diffusion zone, said needle being connected at one end by a two-way valve to the reactant source and to a neutral gas source and at the other end by a two-way valve to the precursor source and to a neutral gas source.

14. The deposition device according to claim 1, wherein the at least first injector and/or at least second injector each comprises one or more nozzles evenly distributed in the inlet zone.

15. The deposition device according to claim 1, wherein the diffusion zone has an acute hyperbolic shape.

16. A process for depositing at least one chalcogenide thin film on at least one side of an element to be treated using a deposition device according to claim 1, the process comprising:
   a) placing the element in the device so that at least one side is located in the diffusion zone;
   b) activating the pump;
   c) injecting the inlet zone with at least one precursor;
   d) purging the diffusion zone;
   e) injecting the reactant and generating hydrogen radical so as to form $H_2S$;
   f) purging; and
   g) repeating c) to f) until a chalcogenide film of the desired thickness is obtained.

17. The deposition process according to claim 16, wherein the pump is stopped at least during the injection of the at least one precursor.

18. The deposition process according to claim 16, further comprising, prior to a):
   injecting a neutral gas along an inner side of the diffusion zone downstream of the injection zone.

19. The deposition process according to claim 16, wherein the reactant is injected at a velocity higher than an average velocity of the hydrogen radical flow.

20. The deposition device according to claim 1, wherein the at least second injector ensures the injection of the precursor into a central zone of the inlet zone.

* * * * *